(12) United States Patent
Riemann et al.

(10) Patent No.: US 9,422,636 B2
(45) Date of Patent: Aug. 23, 2016

(54) METHOD AND APPARATUS FOR PRODUCING SINGLE CRYSTALS COMPOSED OF SEMICONDUCTOR MATERIAL

(75) Inventors: Helge Riemann, Schulzendorf (DE); Nikolai V. Abrosimov, Berlin (DE); Joerg Fischer, Berlin (DE); Matthias Renner, Koenigs Wusterhausen (DE)

(73) Assignee: FORSCHUNGSVERBUND BERLIN E.V., Berlin (DE)

( * ) Notice: Subject to any disclaimer, the term of this patent is extended or adjusted under 35 U.S.C. 154(b) by 1078 days.

(21) Appl. No.: 13/511,751

(22) PCT Filed: Nov. 23, 2010

(86) PCT No.: PCT/DE2010/001371
§ 371 (c)(1),
(2), (4) Date: May 24, 2012

(87) PCT Pub. No.: WO2011/063795
PCT Pub. Date: Jun. 3, 2011

(65) Prior Publication Data
US 2012/0285369 A1    Nov. 15, 2012

(30) Foreign Application Priority Data
Nov. 24, 2009   (DE) .................... 10 2009 056 125

(51) Int. Cl.
*C30B 15/14* (2006.01)
*C30B 15/10* (2006.01)
*C30B 29/06* (2006.01)

(52) U.S. Cl.
CPC .............. *C30B 15/14* (2013.01); *C30B 15/10* (2013.01); *C30B 29/06* (2013.01); *Y10T 117/1056* (2015.01)

(58) Field of Classification Search
CPC combination set(s) only.
See application file for complete search history.

(56) References Cited

U.S. PATENT DOCUMENTS 2,961,305 A    11/1960  Dash
3,096,158 A *  7/1963  Gaule et al. ................... 117/217

(Continued)

FOREIGN PATENT DOCUMENTS

| CA | 713524 A | 7/1965 |
| DE | 2110882 A1 | 3/1972 |
| DE | 2416489 A1 | 4/1975 |
| DE | 3007377 A1 | 9/1981 |
| DE | 3519632 A1 | 1/1986 |

(Continued)

*Primary Examiner* — Duy Deo
*Assistant Examiner* — Erin Bergner
(74) *Attorney, Agent, or Firm* — Leydig, Voit & Mayer, Ltd.

(57) ABSTRACT

A method for producing a single crystal of semiconductor material having material properties of a zone-pulled single crystal includes providing a vessel transmissive to high frequency magnetic fields and having a granulate of a granular semiconductor material disposed therein and a first conductor disposed externally thereto. A high frequency current is supplied to a planar inductor disposed above the vessel, the planar inductor having a turn and a slit as a current supply so as to produce an open melt lake on the granulate by a temperature field at a surface of the granulate produced by thermal power of the planar inductor and a heating action of the first inductor, the melt lake being embedded in unmelted material of the granular semiconductor material and not being in contact with a wall of the vessel. A single crystal is pulled form the melt lake of the semiconductor material upwards.

14 Claims, 1 Drawing Sheet

(56) References Cited

U.S. PATENT DOCUMENTS

| | | | |
|---|---|---|---|
| 3,160,497 A * | 12/1964 | Yen | C22B 4/00 |
| | | | 117/34 |
| 4,133,969 A | 1/1979 | Zumbrunnen | |
| 4,548,670 A | 10/1985 | Pinkhasov | |
| 4,575,401 A | 3/1986 | Pinkhasov | |
| 5,462,011 A | 10/1995 | Tomzig et al. | |
| 2005/0178319 A1 | 8/2005 | Korus et al. | |
| 2005/0188918 A1 * | 9/2005 | Abrosimov | C30B 13/20 |
| | | | 117/200 |

FOREIGN PATENT DOCUMENTS

| | | |
|---|---|---|
| DE | 3525177 A1 | 1/1986 |
| DE | 4318184 A1 | 12/1994 |
| DE | 4447398 A1 | 6/1996 |
| DE | 10217946 A1 | 11/2003 |

* cited by examiner

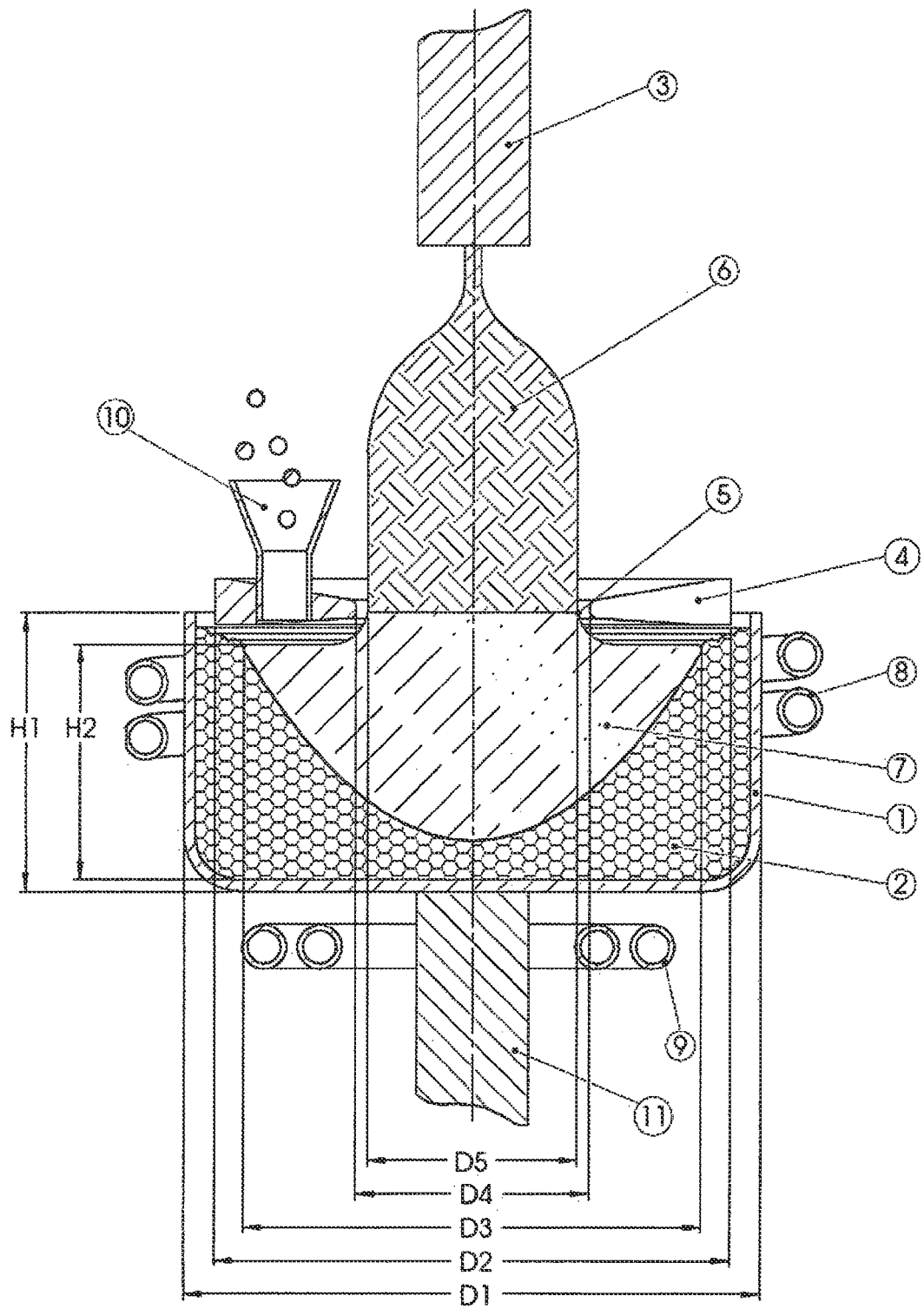

METHOD AND APPARATUS FOR PRODUCING SINGLE CRYSTALS COMPOSED OF SEMICONDUCTOR MATERIAL

CROSS-REFERENCE TO PRIOR APPLICATIONS

This application is a U.S. National Phase application under 35 U.S.C. §371 of International Application No. PCT/DE2010/001371, filed on Nov. 23, 2010, and claims benefit to German Patent Application No. DE 10 2009 056 125.0, filed on Nov. 24, 2009. The International Application was published in German on Jun. 3, 2011 as WO 2011/063795 under PCT Article 21(2).

FIELD

The invention relates to a method and an apparatus for producing single crystals composed of semiconductor material.

BACKGROUND

Because of the greatly increased and still growing need for single-crystal silicon as a starting material of solar cells and for electronics, methods are being developed with which single crystals of large dimensions, having the fewest possible impurities, can be produced cost-effectively. Thus, various methods for producing single crystals of this type are conventional and have been described.

A conventional and widespread standard method for producing single crystals is the Czochralski method, in which the semiconductor material which is to be pulled to form a single crystal is melted in a quartz crucible, and the crystal is pulled upwards from this melt. The major drawbacks of this method are that the melt always attacks the crucible, contaminating the melt and thus the crystal, and the quartz crucible has to be replaced after a relatively short operating life. There are also solutions for achieving a longer operating life for the quartz crucible by complex methods, as is described in DE 102 17 946 A1. However, only a crystal having the impurities typical of CZ is ever pulled, and said impurities are also distributed axially inhomogeneously.

DE 24 16 489 describes a method for growing single crystals composed of silicon, which are low in or free of inclusions, by the Czochralski method, in which the drawbacks of the Czochralski method are supposed to be overcome by using a melted supply rod as a material source instead of a crucible, analogously to the pedestal method. When an inductor is used as a heat source and the frequency of the alternating current flowing through the inductor is selected in an adapted manner, a solid edge layer is not melted, as a result of the current displacement in combination with the lateral heat losses on the surface of the supply rod, and thus forms a vessel for the melt and thus makes it possible to pull a crystal free from foreign crucible materials, similarly to the pedestal method. A major drawback of this solution is that only crystals having a substantially smaller diameter than the supply rod can be pulled. Moreover, in this solution, based on the relatively good conductivity of the compact material, the non-melting edge of the supply rod has to give off a large amount of heat in order to be stabilised, and this heat has to be compensated by the inductive energy supply.

The method described in DE 44 47 398 is also supposed to overcome the drawbacks of the Czochralski method. For this purpose, the semiconductor material located in the crucible is initially melted using an induction coil. This initially results in a melt, which fills the crucible. The heating power is subsequently reduced until a stable solid layer forms on the inner crucible wall. The solidified edge layer acts as a passivation layer, and as a base body additionally provides automatic stabilisation of the melt temperature. During the phase of super heating the melt, it enters a reaction with the outer wall of the crucible, causing oxygen and other impurities to enter the melt. As in the previous example, in this solution too a large amount of energy has to be emitted to the cooler environment in the edge regions, so as to stabilise the solid edge layer in this case too. The volume of the crystal to be produced with the proposed apparatus is limited, since the lack of options for super heating the melt means that recharging with solid Si is not possible, and recharging with liquid silicon would lead to the inclusion of foreign substances.

A further method is the floating zone (FZ) method, with which high-purity single Si crystals can be pulled. DE 30 07 377 A1 describes the basic principles of the FZ method. A drawback in this case is the limited diameter and the high production costs of adapted polycrystalline raw rods.

A third method for producing single crystals is the pedestal method, which also does not use a crucible. A polycrystalline rod is melted by an inductor over the entire upper end face thereof. The melted zone is brought into contact with a seed crystal through the opening of the inductor and, unlike in the zone melting method, the growing single crystal is pulled upwards. A major drawback of the pedestal method is that the diameter of the pulled crystal is always much smaller than that of the inductor opening and that of the raw rod.

The main method steps and apparatus features which are characteristic of the pedestal method are described in DE 21 10 882 A1. A polycrystalline rod consisting of semiconductor material is melted at the crest thereof by a heater, from which a single crystal is subsequently pulled.

A further example of pulling a single crystal by the pedestal method is described in detail in CA 713524 A.

U.S. Pat. No. 2,961,305 A describes a solution for pulling a single crystal by the pedestal method.

The major drawback of the conventional pedestal method is that the pulled single crystal always has a smaller diameter than the raw rod used. The raw rod in turn has a limited diameter, determined by the Siemens method for producing silicon. In particular, for a large crystal diameter, the ratio of said crystal diameter to the supply rod diameter becomes even more unfavourable, for heating-related reasons. Further solutions include using the pedestal method for overcoming these drawbacks.

Thus, DE 35 19 632 A1 describes a method and an apparatus for pulling monocrystalline silicon rods in which a silicon granulate is filled into a vessel, in which a melt lake, from which the single crystal can be pulled, is to be produced on the surface. To produce the melt lake, the granulate is heated, using the flow of current between two silicon electrodes penetrating into the granulate, until a melt lake is formed. However, this method cannot be carried out in practice, since the electrodes, which have to be made of silicon so as not to contaminate the resulting melt and thus the crystal to be pulled, have a specific electrical resistivity about 30 times that of the resulting melt at the melting point. Thus, per unit volume, only approximately 3% of the supplied electrical energy is converted to heat in the melt lake, whilst the remaining approximately 97% of the electrical energy has to be released in the solid silicon electrodes, and this means that either said electrodes would melt themselves or the melt would solidify.

A further example is described in DE 35 25 177 A1. In this case, the silicon electrodes are inserted into holes, which are formed in a solid silicon block. By heating the silicon electrodes and cooling the silicon block, an arc is to be produced between two silicon electrodes and be ignited by a third silicon electrode. The drawback of this solution is in particular that the electrodes additionally have to be heated and the silicon block has to be cooled. It is also doubtful whether the two electrodes in the proposed arrangement would actually, in practice, form a melt lake from which a silicon single crystal can subsequently be pulled. The energy problem described above in relation to DE 35 19 632 A1 applies in this case too.

DE 43 18 184 A1 describes a method and an apparatus for pulling single crystals from a melt. The method provides that a monocrystalline seed crystal evolves into a single crystal in that the seed crystal is dipped into the melt and raised vertically from the melt in a controlled manner. The melt forms a melt lake, which is held on a solid support body, produced from the semiconductor material, merely by the surface tension and by electromagnetic forces in an induction coil. As the single crystal grows, semiconductor material in solid or liquid form is recharged into the melt. Additionally heating the support body effectively assists the induction coil, which acts as the heat source for producing and/or maintaining the melt lake, and heat losses which necessarily occur when the semiconductor material is recharged can thus be compensated. The induction coil is preferably planar and is located above the support body, at a variable distance therefrom. The melt lake rests on the support body, which can be heated by a resistance heater which is arranged in a cavity of the support body as an additional heat source. The support body is preferably assembled from a plurality of segments rather than being formed from a single piece. Adapted shaping of the individual segments provides a cavity, for receiving the additional resistance heater, in the support body. The drawback of this solution is in particular that the support body has to be manufactured from silicon in a highly complex manner, and has to be returned to the original state thereof by further mechanical machining after the pulling process is complete. Moreover, the resistance heater leads to a considerable additional energy requirement. Since the support body is manufactured from solid silicon, additional measures are required so as to maintain a temperature gradient between the resistance heater and the melt lake, in such a way that the melt volume and the support body itself simultaneously remain stable.

SUMMARY

In an embodiment, the present invention provides a method for producing single crystals of semiconductor material having material properties of a zone-pulled single crystal. A vessel transmissive to high frequency magnetic fields is provided and has a granulate of a granular semiconductor material disposed therein and a first inductor disposed externally thereto. A high frequency current is supplied to a planar inductor disposed above the vessel, the planar inductor having a turn and a slit as a current supply, so as to produce an open melt lake on the granulate by a temperature field at a surface of the granulate produced by thermal power of the planar inductor and a heating action of the first inductor, the melt lake being embedded in unmelted material of the granular semiconductor material and not being in contact with a wall of the vessel. A single crystal is pulled form the melt lake of the semiconductor material upwards on a seed crystal through a central opening of the planar inductor.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

The single FIGURE shows a schematic side view of the apparatus according to an embodiment of the invention.

DETAILED DESCRIPTION

An embodiment of the invention provides a method and an apparatus with which single crystals, having the material properties of the FZ method and having in principle unlimited diameters and lengths, can be produced cost-effectively in a continuous process. In order to prepare the semiconductor melt, a crucible of the material is produced and is located in a simple vessel. No electrodes or resistance heaters are to be used for the energy supply. The method is intended to provide a favourable energy balance and only small energy losses.

A monocrystalline seed crystal is dipped into the melt surface, partially melted on, and moved vertically in a controlled manner, causing a single crystal to evolve. This basic production process for the single-crystal silicon is virtually identical irrespective of the use thereof, for example in electronics or in the solar industry.

In an embodiment, a single crystal is pulled from a melt which forms a melt lake on the surface of a semiconductor material. The single crystal is pulled on a seed crystal through the central opening of an inductor. The inductor is formed from a planar disc. The semiconductor material on which the melt lake is formed is in the form of a granulate in a vessel which is transmissive to high-frequency magnetic fields. This granular semiconductor material effectively forms an "inherent crucible" for the melt lake, in such a way that this "inherent crucible" consists of the same material as the melt. The method according to the invention exploits the physical effect of the particularly low thermal and electrical conductivity of the loose granulate as compared with the compact, solid intermediate layer and the melt. Because of the gaps and because the individual grains are only connected at points, the granulate has a very low electrical conductivity between the individual grains, and therefore no significant eddy currents are induced in the granulate. As a result, the granulate is only heated slightly by the inductor. Strong inductive eddy currents form in the melt, which in this case has the highest conductivity, in such a way that the greatest power input also takes place there and thus the highest temperatures are produced there, apart from the local super heating on the free surface. Since the granular semiconductor material is also a relatively poor conductor of heat, the size of the melt lake can be controlled using the inductor arranged above the melt lake. Moreover, it is thereby ensured that the melt does not come into contact with the vessel, and as a result the purity of the melt can be maintained without any particular purity requirements having to be placed on the vessel.

For reasons stated above, in an embodiment, exclusively inductive heating is used to provide the temperature in the melt lake. The melt lake, which is enclosed by the granulate, is mainly produced by the energy of the inductor arranged above the surface thereof, which is supplied at a high frequency (HF) of 1 to 4 MHz. Because of the distance between the inductor and the surface and because of the supplied HF current, the size and depth of the melt lake can be controlled well. The shape of this inductor is selected in such a way that the induced power distribution thereof produces a melt lake the depth of which is at least 20% of the diameter thereof and the clear surface of which extends at least 5-10 mm further laterally than the outline of the inductor. The inductor comprises a central opening which corresponds to the desired crystal cross-section. With a single-turn inductor comprising a main slit and a round central opening, for example, a virtually rotationally symmetric temperature distribution is produced, and thus a virtually round melt lake is produced and a crystal having a round cross-section is pulled from the central opening. Pulling a round crystal is preferably promoted in that the pulling apparatus rotates together with the growing crystal about the axis thereof.

By selecting different inductor shapes, for example with central openings of a rectangular or polygonal shape or combined with additional slits, a correspondingly geometrically altered temperature distribution is produced which is favourable for growing crystals having a rectangular or polygonal cross-section, and in these cases the crystal rotation should basically be stopped. The lateral extent of the inductor surpasses the crystal cross-section on all of the outer edges by more than 20-30 mm and is preferably 1.5 to 2 times the crystal cross-section.

In an embodiment, it is advantageous to rotate the vessel slowly about the axis thereof so as to provide a round melt lake and uniform melting of the recharged material.

So as to make the melt lake sufficiently deep in the centre for large crystal cross-sections, and thus to be able to supply sufficient melt heat when recharging granular semiconductor material, an additional induction heater is provided in an embodiment, and heats the melt lake predominantly from below, again without supplying significant energy to the granulate. This induction heater is in the form of a coil, which is supplied with a high-frequency current of a lower frequency of approximately 5 to 500 kHz and the turns of which are arranged around the vessel. The frequency-based large penetration depth and the selection of the arrangement of the induction coil mean that heat energy is preferably induced at the boundary region between the granular semiconductor material and the melt. At the same time, between the vessel wall and the melt lake a temperature gradient is selectively set up such that the semiconductor material in the environment of the unheated vessel wall remains stable, i.e. has a sufficient thermal and electrical resistance. Thus, it is ensured that the melt out of which the single crystal is pulled does not come into contact with the vessel wall, and no substances which might contaminate the melt can be released from said wall. To produce an optimum melt lake, it may be advantageous to provide a further, preferably planar inductor directly below the vessel. Alternatively, the two further inductors which are arranged around the vessel and under the base of the vessel are connected to form a single coil.

In an embodiment, the granular semiconductor material advantageously consists of broken pieces or of fluidised bed granulate. The preferred grain size is approximately 0.01 mm to 20 mm.

In an embodiment, an apparatus is used which is basically similar to apparatuses for carrying out a pedestal method. A disc-shaped, single-turn inductor, through the central opening of which the single crystal is pulled, is arranged above the vessel in which the granular semiconductor material is located and on which the melt lake is produced. The cross-section of the central opening is dimensioned in accordance with the cross-section of the crystal to be pulled. A crystal having a round cross-section is pulled from a round central opening. Central openings having a rectangular or polygonal cross-section, or combined with additional slits, produce correspondingly geometrically altered temperature distributions, which are favourable for the growth of crystals having a rectangular or polygonal cross-section. Above the inductor, there is a conventional pulling apparatus having the seed crystal fixed thereto. The vessel is of a diameter and a height such that there is at least a sufficient thickness of unmelted semiconductor material between the vessel wall and the melt lake in all directions. The resulting "inherent crucible" has a wall thickness of a few centimetres. The vessel consists of an electrically insulating and temperature-resistant material which is transmissive to high-frequency magnetic fields. There are no particular requirements on the material of the vessel as regards the purity or the chemical and mechanical/thermal stability. Quartz glass is suitable as a vessel, for example. The vessel must not be movable vertically. The disc-shaped inductor above the vessel is configured to be movable vertically relative to the vessel.

In an embodiment, the induction coil arranged around the vessel has approximately 3-5 turns, and is arranged substantially at the level of the melt lake, at a distance of ≤5 mm from the outer wall of the vessel. The induction coil arranged under the vessel is likewise at a distance of ≤5 mm from the base of the vessel.

In an embodiment, a feed line is provided for recharging granular semiconductor material, and passes through an additional opening in the inductor into the vessel, in such a way that the recharged semiconductor material is refilled onto the edge of the melt lake, in such a way that on the one hand the level thereof remains constant, and on the other hand the granulate grains melt before they can float as far as the crystalline phase boundary, spoiling the single-crystal property.

If the granulate quality is not sufficient for crystal growth, as an alternative polycrystalline semiconductor rods for example may also be used as raw rods in this method for a subsequent FZ crystal growth. Further advantageous embodiments may be taken from the dependent claims.

The advantages of the method according to the invention are that a single crystal having the material properties of a zone-pulled single crystal can be pulled in a continuous process, and the cross-section thereof is not fundamentally determined by the raw material, as is the case in the FZ and pedestal methods. This cross-section thereof is in principle defined by the cross-section of the central opening of the inductor used. The length thereof is in particular defined by the size of the gas-tight growing chamber of the system in which the apparatus according to the invention is arranged and by the path length of the pulling apparatus used. The vessel used for receiving the granular semiconductor material has to consist of electrically insulating, non-magnetic material, for example of cost-effective quartz glass, since it does not come into contact with the melt and basically does not seal. The semiconductor material may be in the form of cost-effective granulate or granular broken pieces. The energy balance of the method according to the invention is better than in the comparable method from the known prior art.

The method according to the invention and the apparatus for carrying out this method are explained in greater detail in the following by way of an embodiment. In the selected example, a silicon crystal having a diameter of approximately 50 mm is to be pulled.

The appended drawing includes a schematic side view of the apparatus according to the invention, with which the method according to the invention is carried out. The apparatus shown is accommodated in the gas-tight argon-filled growing chamber of an FZ system. In the selected example, a single crystal having a round cross-section is to be pulled. The vessel 1, in which the starting material for producing the silicon crystal is located in the form of silicon granulate 2, is arranged on a lower pulling spindle 11 of the FZ system. The vessel 1 used consists of standard quartz glass and has a diameter D1 of approximately 20 cm and a height H1 of approximately 10 cm. In the selected example, the vessel 1 is filled with the silicon granulate 2 to a height of approximately 9 cm. The grain size of the silicon granulate 2 is approximately 0.3 to 3 mm.

A single-turn, disc-shaped, round inductor 4, having a round central opening 5 and a main slit to which the two current supplies are connected, is arranged above the vessel 1, over the silicon granulate 2. The diameter D2 of the inductor 4 is smaller than the diameter D1 of the vessel 1, in such a way that said inductor can be positioned tightly on the surface of the granulate. In the selected example, the diameter D4 of the round central opening 5 of the inductor 4 is approximately 60 mm. Thus, a crystal 6 having a diameter D5 of approximately 50 mm can be pulled. The inductor 4 is flowed through by HF current having a frequency of approximately 3 MHz at a generator power of approximately 25 kW. This inductor 4 generates a rotationally symmetrical temperature field, maintaining a round melt lake 7. In the selected example, the diameter D3 of the melt lake 7 is approximately 120 mm. Above the inductor 4 is the upper pulling spindle 3, which carries the seed crystal and later the growing single crystal 6 and pulls them upwards out of the melt.

A further inductor 8 is arranged around the vessel 1, and is formed as a multi-turn induction coil. The turn count is approximately 4 turns and the distance of the turns from the outer wall of the vessel 1 is approximately 3 mm. The induction coil 8 has a height of approximately 30 mm, and is arranged in the upper region of the vessel. It is flowed through by HF current having a frequency of approximately 10 kHz and a power of approximately 3 kW. The temperature field generated by the cylindrical inductor 8 means that centrally, below the melt lake 7, the silicon granulate 2 is kept at a melt temperature of approximately 1412° C. In the silicon granulate 2, because of the high electrical and thermal resistance thereof, a temperature gradient is produced such that there is a temperature of at most approximately 500° C. at the inner wall of the vessel 1. Since the silicon granulate 2 is of the required purity, and the melt only comes into contact with the silicon granulate 2 and not with the housing wall, virtually no impurities from said wall arrive in the melt and in the pulled single crystal 6. Therefore, an "inherent crucible" is referred to in this arrangement, since the crucible is formed by semiconductor material of the same type.

In the selected example, the apparatus according to the invention comprises an additional inductor 9, which is arranged below the vessel 1. This further inductor 9 is preferably formed as a planar, multi-turn, spiral induction coil. This additional inductor 9 means that the size and in particular the depth of the melt lake 7 can be controlled optimally by acting on the boundary surface with the silicon granulate 2.

With a recharging apparatus 10, sufficient granulate 2 for the level H2 of the melt lake 7 always to remain constant is recharged through an additional opening in the inductor 4, as a function of the pulling speed and the diameter D5 of the crystal 6. Thus, the crystal 6 can be pulled continuously without the material from the granulate of the inherent crucible being consumed. The vessel 1 is rotated about the axis thereof at approximately 3 rpm together with the lower pulling spindle 11. The recharged material thus melts uniformly, and so a round melt lake 7 is always maintained, and incompletely melted granulate 2 is prevented from reaching the growth boundary of the crystal 6.

When the crystal 6 has reached the desired length, which is defined by the dimensions of the pulling apparatus, it is pulled away from the melt, and after the currents through the inductor 4 and the induction coil 8 and if applicable the induction coil 9 have been switched off, the semiconductor material remaining in the melt lake 7 solidifies.

If the device is prepared for a new pulling process, after preheating, the solidified melt lake 7 can be melted again by induction, and after recreating the melt level and seeding a seed crystal, a new pulling processes can be begun.

While the invention has been described with reference to particular embodiments thereof, it will be understood by those having ordinary skill the art that various changes may be made therein without departing from the scope and spirit of the invention. Further, the present invention is not limited to the embodiments described herein; reference should be had to the appended claims.

LIST OF REFERENCE NUMERALS 1 vessel
2 silicon granulate
3 upper pulling spindle
4 single-turn, disc-shaped inductor
5 central opening of the inductor 4
6 crystal
7 melt lake
8 multi-turn cylindrical inductor
9 multi-turn planar inductor
10 recharging apparatus
11 lower pulling spindle
D1 vessel diameter
D2 diameter of the inductor 4
D3 diameter of the melt lake
D4 diameter of the central opening of the inductor 4
D5 crystal diameter
H1 height of the vessel
H2 level of the melt lake

The invention claimed is:

1. A method for producing a single crystal of semiconductor material, the method comprising:
providing a granulate of a granular semiconductor material disposed in a vessel and a first inductor disposed externally to the vessel, the vessel being transmissive to high frequency magnetic fields;
supplying a high frequency current to a planar inductor disposed above the vessel, the planar inductor having a turn and a slit as a current supply, so as to produce an open melt lake on the granulate by a temperature field at a surface of the granulate produced by thermal power of the planar inductor and a heating action of the first inductor, the melt lake being embedded in unmelted material of the granular semiconductor material and not being in contact with a wall of the vessel; and
pulling from the melt lake a single crystal of the semiconductor material upwards on a seed crystal through a central opening of the planar inductor.

2. The method as recited in claim 1, wherein the granular semiconductor material has a grain size of 001 mm to 20 mm.

3. The method as recited in claim 1, wherein the single crystal has a round cross section, and the central opening has a round cross section.

4. The method as recited in claim 1, wherein the single crystal is a round crystal, and an upper spindle rotates about an axis of the upper spindle together with the crystal.

5. The method as recited in claim 1, wherein the single crystal has a rectangular cross section, and the central opening has a rectangular cross section.

6. The method as recited in claim 1, wherein the single crystal has a polygonal cross section, and the central opening has a polygonal cross section.

7. The method as recited in claim 1, wherein the high frequency current has a frequency of between 1 and 4 MHz.

8. The method as recited in claim 1, wherein the high frequency current has a frequency of between 5 and 500 kHz.

9. The method as recited in claim 1, wherein the melting includes recharging the granular semiconductor material into the melt lake according to a pulling speed of the single crystal such that a level of the melt lake in the vessel remains constant.

10. The method as recited in claim 1, wherein the vessel rotates about a vessel axis together with the granular semiconductor material.

11. The method as recited in claim 1, wherein the planar inductor is a pancake inductor.

12. The method as recited in claim 1, comprising exclusively inductive heating to provide a temperature in the melt lake.

13. The method as recited in claim 1, wherein the single crystal in the pulling has a round cross-section, and
   wherein the planar inductor is disc-shaped inductor having a round cross-section.

14. The method as recited in claim 1, wherein the pulling includes rotating an upper pulling spindle about its axis together with a growing, round crystal.

\* \* \* \* \*